US012598721B2

(12) United States Patent
Hnayno et al.

(10) Patent No.: US 12,598,721 B2
(45) Date of Patent: Apr. 7, 2026

(54) COOLING ASSEMBLY AND METHOD FOR COOLING A PLURALITY OF HEAT-GENERATING COMPONENTS

(71) Applicant: OVH, Roubaix (FR)

(72) Inventors: Mohamad Hnayno, Roubaix (FR); Ali Chehade, Moncheaux (FR); Henryk Klaba, Roubaix (FR)

(73) Assignee: OVH, Roubaix (FR)

( * ) Notice: Subject to any disclaimer, the term of this patent is extended or adjusted under 35 U.S.C. 154(b) by 273 days.

(21) Appl. No.: 18/236,033

(22) Filed: Aug. 21, 2023

(65) Prior Publication Data

US 2024/0074103 A1     Feb. 29, 2024

(30) Foreign Application Priority Data

Aug. 25, 2022     (EP) .................................... 22306267

(51) Int. Cl.
H05K 7/20          (2006.01)
(52) U.S. Cl.
CPC ..... H05K 7/20272 (2013.01); H05K 7/20236 (2013.01); H05K 7/20772 (2013.01)
(58) Field of Classification Search
CPC ........... H05K 7/20272; H05K 7/20236; H05K 7/20772
USPC ........................................................ 361/699
See application file for complete search history.

(56) References Cited

U.S. PATENT DOCUMENTS 6,999,316 B2 *   2/2006  Hamman ................ G06F 1/203
                                                    165/104.31
7,318,322 B2     1/2008  Ota et al.
7,508,665 B1 *   3/2009  Palmer ................ H05K 7/2079
                                                    361/696
7,808,780 B2 *  10/2010  Brunschwiler .... H05K 7/20772
                                                    165/185

(Continued)

FOREIGN PATENT DOCUMENTS

CN        108124408 B    8/2019
CN        111615289 A    9/2020
(Continued)

OTHER PUBLICATIONS

CN 111615289A English translation (Year: 2020).*
(Continued)

*Primary Examiner* — Anatoly Vortman
(74) *Attorney, Agent, or Firm* — BCF LLP

(57)          ABSTRACT
A cooling assembly and method for cooling a plurality of heat-generating components. The cooling assembly includes a main liquid inlet for receiving a heat-transfer liquid, a main liquid outlet for discharging the heat-transfer liquid and a plurality of liquid cooling units. Each liquid cooling unit is in thermal contact with a corresponding heat-generating component and includes an internal liquid conduit, the heat-transfer liquid flowing in the internal liquid conduit collecting thermal energy from the corresponding heat-generating component. The liquid cooling units are arranged in a plurality of groups, each group comprising one or more liquid cooling units fluidly connected in parallel to one another. The groups are arranged in at least one cluster, each cluster comprising two or more groups fluidly connected in series.

11 Claims, 7 Drawing Sheets

(56) References Cited

U.S. PATENT DOCUMENTS

| | | | | |
|---|---|---|---|---|
| 7,826,216 B2 * | 11/2010 | Moss | ................. | H05K 7/20736 |
| | | | | 361/679.48 |
| 7,969,727 B2 * | 6/2011 | Tozer | ................. | H05K 7/20818 |
| | | | | 361/679.48 |
| 8,059,405 B2 * | 11/2011 | Campbell | .................. | F28F 3/02 |
| | | | | 361/679.53 |
| 8,164,897 B2 * | 4/2012 | Graybill | ............. | H05K 7/20745 |
| | | | | 361/679.48 |
| 8,345,423 B2 | 1/2013 | Campbell et al. | | |
| 9,042,098 B2 | 5/2015 | Campbell et al. | | |
| 9,049,800 B2 | 6/2015 | Shelnutt et al. | | |
| 10,070,560 B2 | 9/2018 | Campbell et al. | | |
| 10,123,463 B2 | 11/2018 | Best et al. | | |
| 10,162,396 B2 * | 12/2018 | Cui | .................... | H05K 7/20772 |
| 10,225,957 B2 * | 3/2019 | Gao | .................... | H05K 7/20772 |
| 10,925,180 B2 * | 2/2021 | Gao | .................... | H05K 7/20272 |
| 11,019,752 B2 * | 5/2021 | Gao | .................... | H05K 7/20781 |
| 11,197,395 B1 | 12/2021 | Gao | | |
| 11,252,847 B2 * | 2/2022 | Waddell | ................ | H01L 23/427 |
| 2008/0066889 A1 * | 3/2008 | Knight | ............... | H05K 7/20345 |
| | | | | 165/104.21 |
| 2009/0218078 A1 | 9/2009 | Brunschwiler et al. | | |
| 2012/0167597 A1 * | 7/2012 | Wilder | ................. | F25D 31/002 |
| | | | | 165/157 |
| 2020/0288601 A1 * | 9/2020 | Gao | .................... | H05K 7/20272 |
| 2020/0323108 A1 | 10/2020 | Bilan et al. | | |
| 2020/0404812 A1 * | 12/2020 | Gao | ................... | H05K 7/20272 |
| 2020/0404813 A1 * | 12/2020 | Gao | ................... | H05K 7/20745 |
| 2021/0153390 A1 | 5/2021 | Tufty et al. | | |
| 2021/0360821 A1 * | 11/2021 | Gao | ................... | H05K 7/1497 |
| 2023/0018736 A1 * | 1/2023 | Tsai | ................... | H05K 7/20254 |
| 2024/0074103 A1 * | 2/2024 | Hnayno | ............ | H05K 7/20781 |
| 2024/0196563 A1 * | 6/2024 | Jia | ...................... | H05K 7/20263 |
| 2024/0334648 A1 * | 10/2024 | Bauduin | ............. | H05K 7/2079 |
| 2025/0212370 A1 * | 6/2025 | Bauduin | ........... | H05K 7/20263 |

FOREIGN PATENT DOCUMENTS

| | | | | | |
|---|---|---|---|---|---|
| CN | 111431067 B | 10/2021 | | | |
| RU | 2692569 C1 | 6/2019 | | | |
| WO | 2021111387 A1 | 6/2021 | | | |
| WO | WO-2023025093 A1 * | 3/2023 | ......... | H05K 7/20254 |

OTHER PUBLICATIONS

European Search Repoirt with regard to the EP Patent Application No. 22306267.0 completed Feb. 2, 2023.
English Abstract for CN111431067 retrieved on Espacenet on Aug. 21, 2023.
English Abstract for CN108124408 retrieved on Espacenet on Aug. 21, 2023.
English Abstract for CN111615289 retrieved on Espacenet on Aug. 21, 2023.

* cited by examiner

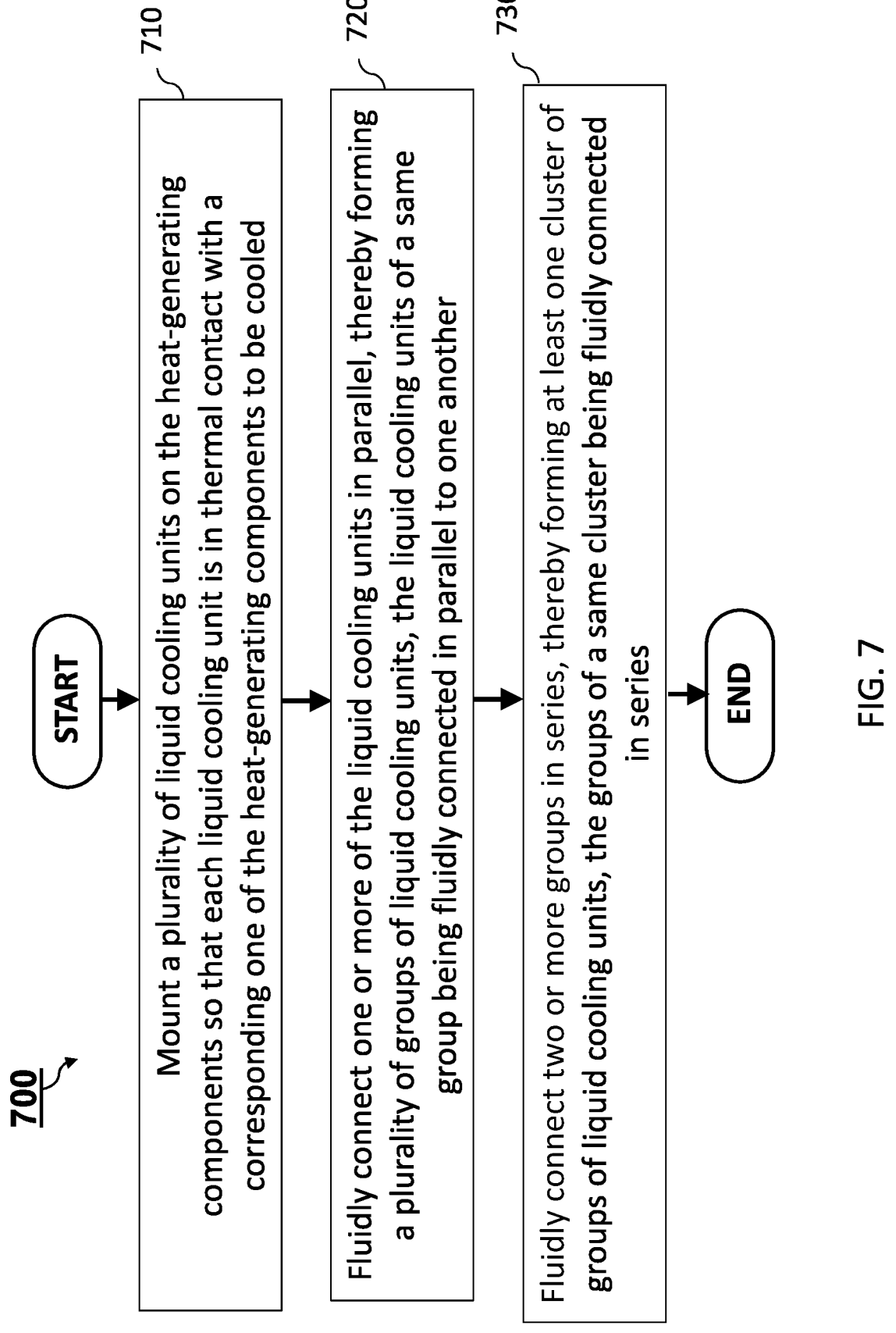

700

START

710
Mount a plurality of liquid cooling units on the heat-generating components so that each liquid cooling unit is in thermal contact with a corresponding one of the heat-generating components to be cooled 720
Fluidly connect one or more of the liquid cooling units in parallel, thereby forming a plurality of groups of liquid cooling units, the liquid cooling units of a same group being fluidly connected in parallel to one another 730
Fluidly connect two or more groups in series, thereby forming at least one cluster of groups of liquid cooling units, the groups of a same cluster being fluidly connected in series

END

FIG. 7

COOLING ASSEMBLY AND METHOD FOR COOLING A PLURALITY OF HEAT-GENERATING COMPONENTS

CROSS REFERENCE

The present application claims priority to EP Application No. 22306267.0, filed Aug. 25, 2022 entitled "Cooling Assembly and Method for Cooling a Plurality of Heat-Generating Components", the entirety of which is incorporated herein by reference.

FIELD

The present technology relates to cooling techniques for electronic equipment. In particular, a cooling assembly and a method for cooling a plurality of heat-generating component are disclosed.

BACKGROUND

Electronic equipment, for example servers, memory banks, computer discs, and the like, is conventionally grouped in equipment racks. Large data centers and other large computing facilities may contain thousands of racks supporting thousands or even tens of thousands of servers.

In order to reduce a surface area occupied by the data center, and thus optimize the ratio of electronic equipment per unit of surface area, it may be desirable to increase a number of pieces of electronic equipment in each rack, that may be thus referred as "high-density rack". However, the racks, including equipment mounted in their backplanes, consume large amounts of electric power and generate significant thermal energy. In such racks, cooling requirements are thus often significant. Therefore, increasing a number of heat-generating components (i.e. pieces of electronic equipment) in a given rack may not be suitable with standard cooling systems.

There is thus a desire to provide a cooling assembly and method for cooling a plurality of heat-generating components in high density racks.

SUMMARY

Embodiments of the present technology have been developed based on developers' appreciation of shortcomings associated with the prior art.

In a first broad aspect, various implementations of the present technology provide a cooling assembly for cooling a plurality of heat-generating components, the cooling assembly comprising a main liquid inlet; a main liquid outlet; a plurality of liquid cooling units. Each liquid cooling unit is in thermal contact with a corresponding one of the heat-generating components to be cooled and comprises a liquid inlet fluidly connected to the main liquid inlet for receiving a heat-transfer liquid therefrom, a liquid outlet fluidly connected to the main liquid outlet for returning the heat-transfer liquid thereto; and an internal liquid conduit extending between the liquid inlet and the liquid outlet, the heat-transfer liquid flowing in the internal liquid conduit collecting thermal energy from the corresponding heat-generating component. The liquid cooling units are arranged in a plurality of groups, each group comprising one or more of the liquid cooling units fluidly connected in parallel to one another; and the groups are arranged in at least one cluster, each cluster comprising two or more of the groups fluidly connected in series.

In some embodiments of the cooling assembly, the at least one cluster comprises a plurality of clusters fluidly connected in parallel, the clusters being fluidly connected in parallel to one another to form an arrangement fluidly connected to the main liquid inlet and the main liquid outlet.

In some embodiments of the cooling assembly, a first number of liquid cooling units per group, a second number of groups per cluster, and a third number of clusters of the cooling assembly are configured to maintain a difference between a first temperature of the heat-transfer liquid at the main liquid inlet and a second temperature of the heat-transfer liquid at the main liquid outlet at or below a first threshold.

In some embodiments of the cooling assembly, the first threshold is 20° C.

In some embodiments of the cooling assembly, the cooling assembly further comprises a plurality of immersion cases filled with a second heat-transfer liquid, the plurality of heat-generating components being immersed in the plurality of immersion cases.

In some embodiments of the cooling assembly, each heat-generating component corresponds to a server in a datacenter.

In some embodiments of the cooling assembly, each cluster comprises a first group in thermal contact with first corresponding servers having a first power consumption level, and a second group in thermal contact with second corresponding servers having a second power consumption level lower than the first power consumption level; and the second group is downstream of the first group within the cluster.

In some embodiments of the cooling assembly, each cluster further comprises a third group in thermal contact with third corresponding servers having a third power consumption level lower than the second power consumption level, the third group being downstream of the second group within the cluster; and a fourth group in thermal contact with fourth corresponding servers having a fourth power consumption level lower than the third power consumption level, the fourth group being downstream of the third group within the cluster.

In some embodiments of the cooling assembly, for each cluster, the liquid cooling units of a given group are associated with servers having corresponding first power consumptions, the liquid cooling units of another group downstream of the given group being associated with servers having corresponding second power consumptions lower than the first power consumptions; the liquid cooling units of a group upstream of all other groups in the cluster being associated with servers having highest power consumptions.

In some embodiments of the cooling assembly, the heat-transfer liquid is water.

In some embodiments of the cooling assembly, each group of liquid cooling units comprises a plurality of liquid cooling units; each group further comprises an outlet manifold fluidly connected to the liquid outlets of the liquid cooling units and configured to receive the heat-transfer from the liquid cooling units of the group; and an inlet manifold fluidly connected to the liquid inlets of the liquid cooling units of the group and configured to receive the heat-transfer liquid from the outlet manifold of a preceding upstream group of liquid cooling units or from the main liquid outlet, the inlet manifold distributing the heat-transfer liquid to the plurality of liquid cooling units of the group.

In some embodiments of the cooling assembly, a number of clusters is three, a number of groups per cluster is four and a number of liquid cooling units per group is sixteen.

In some embodiments of the cooling assembly, a number of clusters is forty-eight, a number of groups per cluster is four and a number of liquid cooling units per group is one.

In a second broad aspect, various implementations of the present technology provide a method for cooling a plurality of heat-generating components. The method comprises mounting a plurality of liquid cooling units on the heat-generating components so that each liquid cooling unit is in thermal contact with a corresponding one of the heat-generating components to be cooled, each liquid cooling unit comprising a liquid inlet for receiving a heat-transfer liquid and a liquid outlet for discharging the heat-transfer liquid, fluidly connecting one or more of the liquid cooling units to form a plurality of groups of liquid cooling units, the liquid cooling units of a same group being fluidly connected in parallel to one another, fluidly connecting two or more groups to form at least one cluster of groups of liquid cooling units, the groups of a same cluster being fluidly connected in series; and fluidly connecting the at least one cluster to a main liquid inlet for delivering the heat-transfer liquid to the liquid inlets of the liquid cooling units and to a main liquid outlet for receiving the heat-transfer liquid from the liquid outlets of the liquid cooling units.

In some embodiments of the method, fluidly connecting the two or more groups to form at the least one cluster of groups of liquid cooling units comprises forming a plurality of clusters, the groups of a same cluster being fluidly connected in series, the plurality of clusters being fluidly connected in parallel to one another, the plurality of clusters being fluidly connected to the main liquid inlet and to the main liquid outlet.

In some embodiments of the method, each heat-generating component corresponds to a server in a datacenter.

In some embodiments of the method, the method further comprises receiving power consumption data comprising information about an expected power consumption of each server; and determining groups of servers of the datacenter based on the power consumption data.

In some embodiments of the method, fluidly connecting two or more groups to form at least one cluster of groups of liquid cooling units comprises disposing a first group in thermal contact with first corresponding servers having a first power consumption level, and disposing a second group in thermal contact with second corresponding servers having a second power consumption level lower than the first power consumption level, the second group being downstream of the first group within the cluster.

In some embodiments of the method, forming the at least one cluster of groups of liquid cooling units, comprises forming the groups of liquid cooling units such that the liquid cooling units of a given group are associated with the servers of a same group of servers having corresponding first power consumptions, the liquid cooling units of another group downstream of the given group being associated with servers having corresponding second power consumptions lower than the first power consumptions, the liquid cooling units of a group upstream of all other groups in the cluster being associated with servers having highest power consumptions.

In some embodiments of the method, the heat-transfer liquid is water.

In some embodiments of the method, each group of liquid cooling units comprises a plurality of liquid cooling units, each group further comprises an outlet manifold fluidly connected to the liquid outlets of the liquid cooling units and configured to receive the heat-transfer from the liquid cooling units; and an inlet manifold fluidly connected to the liquid inlets of the liquid cooling units and configured to receive the heat-transfer liquid from the outlet manifold of a preceding upstream group of liquid cooling units or from the main liquid outlet, the inlet manifold distributing the heat-transfer liquid to the plurality of liquid cooling units.

In some embodiments of the method, a number of clusters is three, a number of groups per cluster is four and a number of liquid cooling units per group is sixteen.

In some embodiments of the method, a number of clusters is forty-eight, a number of groups per cluster is four and a number of liquid cooling units per group is one.

In some embodiment of the method, the method further comprises adjusting a flow rate of the heat-transfer liquid based on a number of liquid cooling units, data comprising information about electric power consumption of the heat-generating components and a desired temperature difference between the temperatures of the heat-transfer liquid at the liquid inlet and the liquid outlet.

In the context of the present specification, unless expressly provided otherwise, electronic equipment may refer, but is not limited to, "servers", "electronic devices", "operation systems", "systems", "computer-based systems", "controller units", "monitoring devices", a "control devices" and/or any combination thereof appropriate to the relevant task at hand.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIG. 7 is a flow-diagram showing operations of a method for cooling a plurality of heat-generating components in accordance with an embodiment of the present technology.

Figure 1:
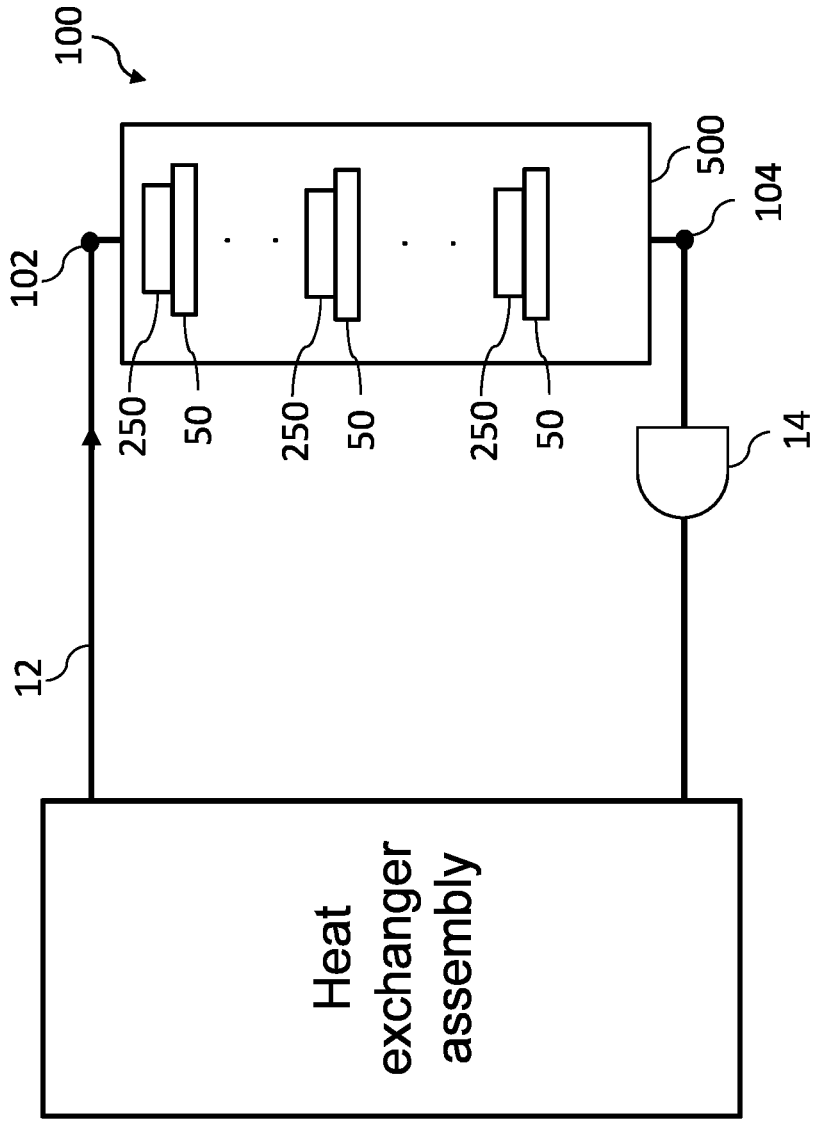
FIG. 1 is a schematic diagram of a cooling system of a server rack in accordance with an embodiment of the present technology.
Figure 1:

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various systems that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future.

With these fundamentals in place, we will now consider some non-limiting examples to illustrate various implementations of aspects of the present technology.

Referring at once to FIGS. 1 to 6, there is described a cooling system 10, and a cooling assembly 100 thereof, for a server rack 500, or simply "rack" 500. The server rack 500 includes one or more heat-generating components 50, the cooling assembly 100 being suitable for collecting thermal energy generated by the one or more heat-generating components 50 and, as such, providing cooling capacity to the server rack 500 implementing non-limiting embodiments of the present technology. It is to be expressly understood that the cooling assembly 100 as depicted is merely an illustrative implementation of the present technology. Thus, the description thereof that follows is intended to be only a description of illustrative examples of the present technology. This description is not intended to define the scope or set forth the bounds of the present technology. In some cases, what are believed to be helpful examples of modifications to the cooling assembly 100 may also be set forth below. This is done merely as an aid to understanding, and, again, not to define the scope or set forth the bounds of the present technology. These modifications are not an exhaustive list, and, as a person skilled in the art would understand, other modifications are likely possible. Further, where this has not been done (i.e., where no examples of modifications have been set forth), it should not be interpreted that no modifications are possible and/or that what is described is the sole manner of implementing that element of the present technology. As a person skilled in the art would understand, this is likely not the case. In addition, it is to be understood that the cooling assembly 100 may provide in certain instances simple implementations of the present technology, and that where such is the case they have been presented in this manner as an aid to understanding. As persons skilled in the art would understand, various implementations of the present technology may be of a greater complexity.

As it will be described in greater details hereinafter, the present disclosure describes a method for cooling a plurality of heat-generating components 50 of the rack 500. As such, any system variation configured to be operatively controlled according to methods described herein can be adapted to execute embodiments of the present technology, once teachings presented herein are appreciated. Furthermore, the cooling assembly 100 will be described using an example of the cooling assembly 100 illustrated in FIGS. 1 to 6. However, embodiments of the present technology can be equally applied to other types of the cooling assembly 100.

FIG. 1 is a schematic diagram of the cooling system 10 adapted for providing cooling to the rack 500. The rack 500 may host a plurality of components, for example servers, network switches, power distribution units, central processing units (CPUs), graphics processing units (GPUs), neural processing units (NPUs), tensor processing units (TPUs), power supply circuitry, and application specific integrated circuits (ASICs), including, for example, ASICs configured for high-speed cryptocurrency mining, random-access memory devices, hard disk drives, and other electric or electronic devices, that, in use generate thermal energy and are presented as heat-generating components 50 on FIG. 1 (only three of which are depicted for simplicity).

The cooling system 10 provides sufficient cooling capacity to maintain all components and heat generating components 50 hosted in the rack 500 at a temperature below a safe temperature threshold. Moreover, in a datacenter, a plurality of cooling systems 10 or portions thereof may independently provide cooling for a plurality of corresponding racks 500.

In this embodiment, the cooling system 10 comprises a main cooling loop 12 conveying a heat-transfer liquid. The main cooling loop 12 includes the cooling assembly 100 for cooling the heat-generating components 50 hosted in the rack 500, the heat-transfer liquid collecting thermal energy upon flowing in the cooling assembly 100. The main cooling loop 12 further includes a heat exchanger assembly 15 (e.g. a air-to-liquid heat exchanger such as dry cooler, a liquid-to-liquid heat exchanger such as a plate heat exchanger, or any other suitable heat exchanger) for discharging thermal energy from the heat-transfer liquid. Cold heat-transfer liquid is further redirected to the cooling assembly 100. The cooling loop 12 further includes a pump 14 for maintaining a flow of the heat-transfer liquid circulating within the cooling loop 12. It is contemplated that, in alternative embodiments, the main cooling loop 12 may be an open cooling loop that receives cold heat-transfer liquid from a liquid supply (e.g. a lake, a river) and returns the heated heat-transfer liquid to the liquid supply or to any other entity suitable for disposing the heated heat-transfer liquid (e.g. a lake, a river). The heat-transfer liquid may be water, a mix of water and glycol, a two-phase liquid of fluid, a dielectric fluid, or any liquid or fluid suitable to collect thermal energy as described herein.

In this embodiment, the cooling assembly includes a main liquid inlet 102 for receiving the heat-transfer liquid and a plurality of liquid cooling units 250 (only three of which are depicted for simplicity) receiving the heat-transfer liquid, each liquid cooling unit 250 being in thermal contact with a corresponding one of the heat-generating components 50 to be cooled. As will be described in greater details herein below, each liquid cooling unit 250 has an external thermal transfer surface configured to be in contact with the heat-generating component 50. It is to be understood that in this context, the external thermal transfer surface is said to be "in contact" with the heat-generating component 50 even in cases where a thermal paste is applied between the external thermal transfer surface and the heat-generating component 50, in a manner that is known in the art, to ensure adequate heat transfer between the heat-generating component 50 and the external thermal transfer surface. It is contemplated that one or more liquid cooling units 250 may be used to cool a same heat-generating components 50.

Figure 2:
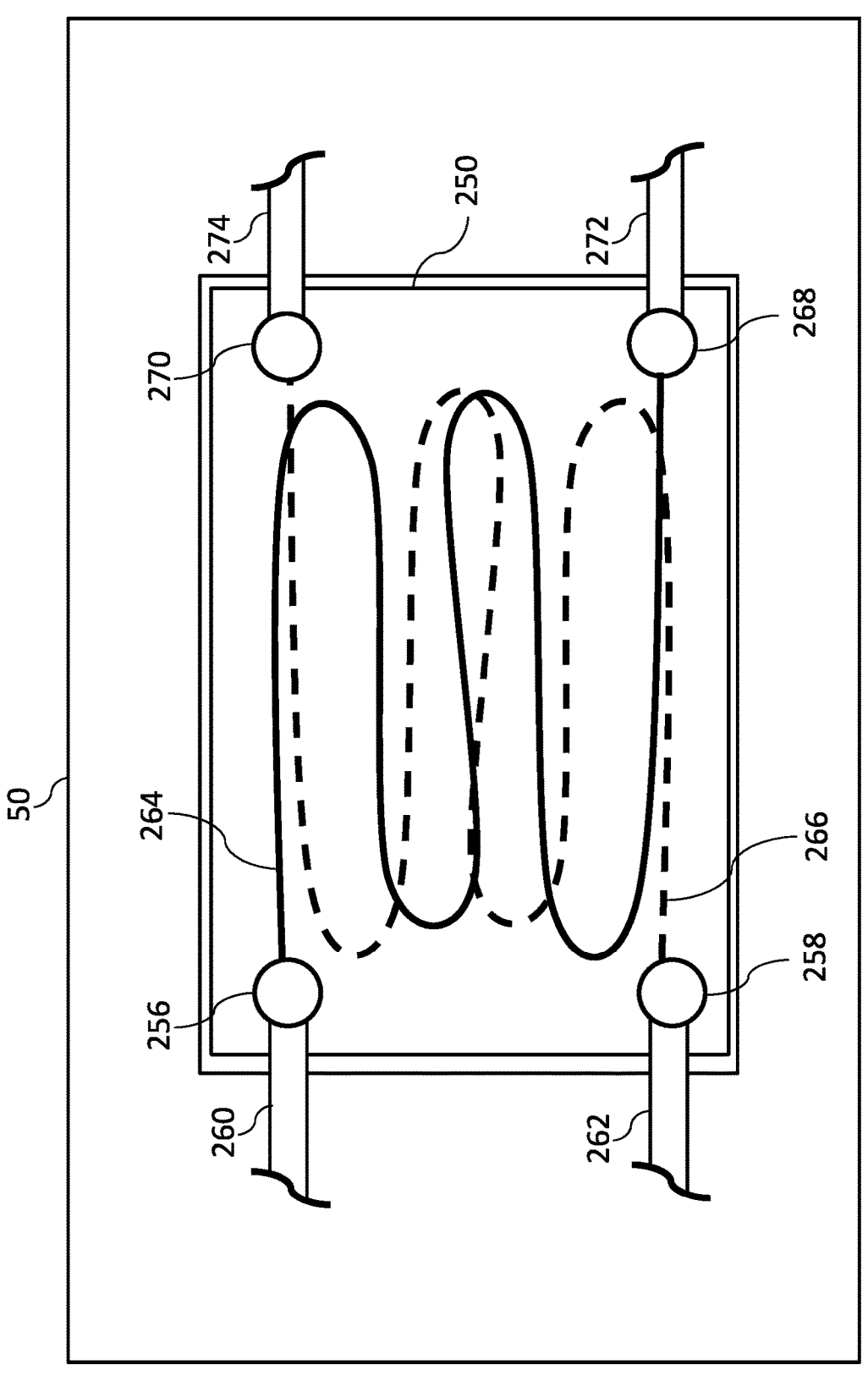
FIG. 2 is a top plan schematic representation of a liquid cooling unit of the cooling system of FIG. 1 in accordance with an embodiment of the present technology.

More specifically, a non-limiting example of a liquid cooling unit 250 is illustrated in FIG. 2, which is a top plan schematic representation of the liquid cooling unit 250 mounted on a heat-generating component 50. The liquid cooling unit 250 is a liquid cooling heat sink, or "water block", which is thermally coupled to the heat-generating component 50 to be cooled, for example on a processor mounted within the server rack 500. The heat-transfer liquid is circulated through an internal liquid conduit in the liquid cooling unit 250 to absorb the heat from the heat-generating component 50. As the heat-transfer liquid flows out of the liquid cooling unit 250, so does the thermal energy absorbed thereby. FIG. 2 is not to scale; while perimeters of the liquid cooling unit 250 and of the heat-generating component 50 may be similar, their relative sizes are for illustration purposes only.

The liquid cooling unit 250 may for example include two redundant liquid inlets 256 and 258 fluidly connected to the main liquid inlet 102 via respective redundant conduits 260 and 262 (only their ends is shown) for receiving the heat-transfer liquid. The heat-transfer liquid may thus flow through redundant internal liquid conduits 264 and 266 that zigzag within the liquid cooling unit 250 to maximize the heat absorption potential of the heat-transfer liquid across a surface of the liquid cooling unit 250. The internal liquid conduits 264 and 266 terminate at two redundant liquid outlets 268 and 270 that are respectively connectable to redundant conduits 272 and 274 (only their ends are shown) for hot heat-transfer liquid output.

Other shapes of the liquid cooling unit 250 and/or shapes of its internal liquid conduits are contemplated in alternative embodiments. For example, the liquid cooling unit 250 may comprise a single internal liquid conduit defining a spiral shape. In at least some embodiments, the liquid inlet 258, the conduit 262, the internal liquid conduit 266, the conduit 274 and the liquid outlet 270 may be omitted such that the liquid cooling unit 250 only includes the liquid inlet 256, the conduit 260, the internal liquid conduit 264, the conduit 272 and the liquid inlet 268.

Referring back to FIG. 1, the liquid outlets 268 and 270 of the liquid cooling units 250 are fluidly connected to a main liquid outlet of the cooling assembly 100. Fluid connection between the liquid cooling units 250 are described in greater details herein after.

Figure 3:
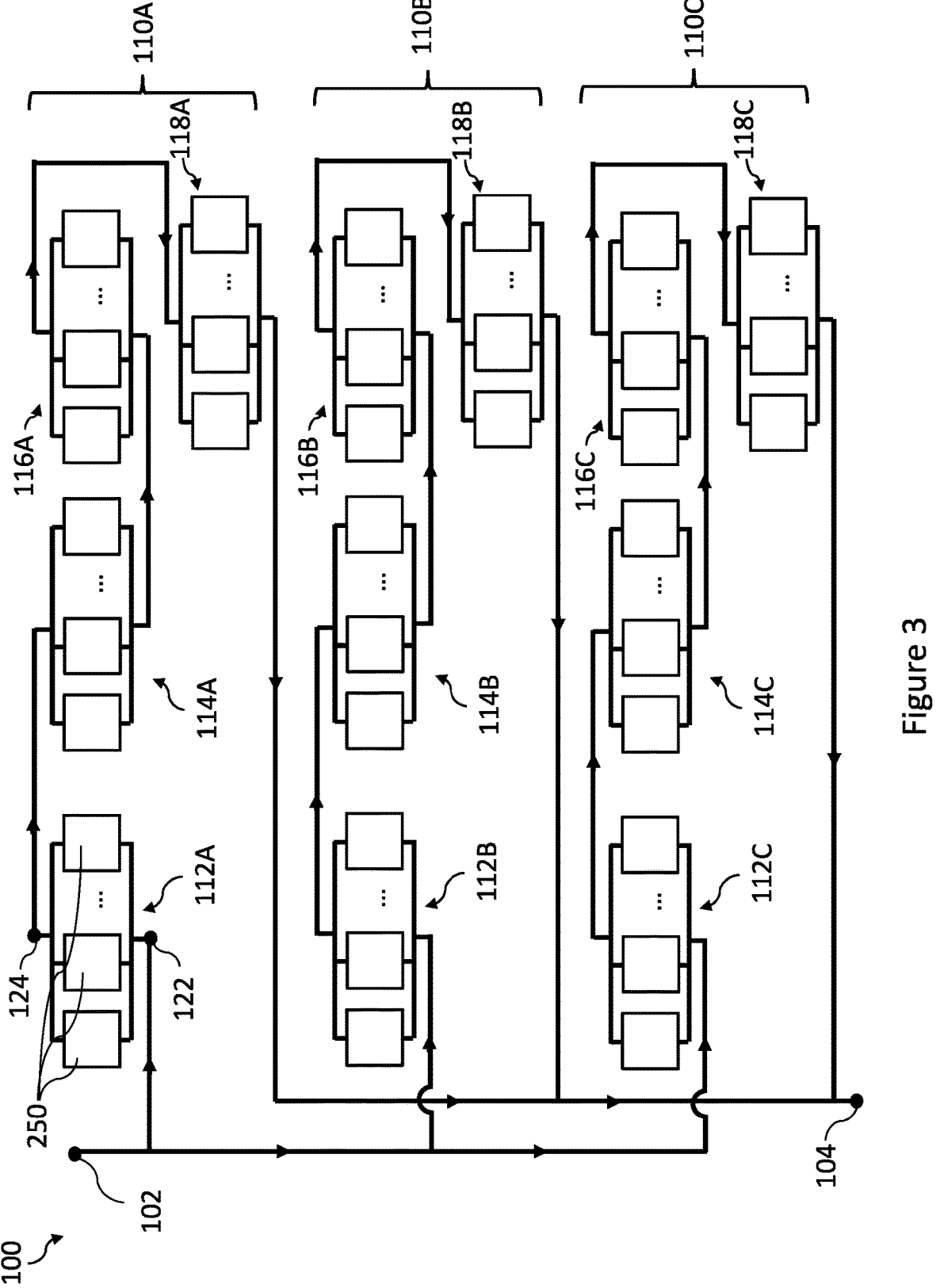
FIG. 3 is a schematic diagram of a cooling assembly of the cooling system of FIG. 1 in accordance with an embodiment of the present technology.

FIG. 3 illustrates fluid connections between the liquid cooling units 250 of the cooling assembly 100 in accordance with an embodiment of the present technology. In this embodiment, the liquid cooling units 250 are fluidly connected to one another such that at least some of the liquid cooling units 250 are fluidly connected in parallel and/or in series. In particular, the liquid cooling units 250 are arranged in a plurality of groups, each group comprising one or more liquid cooling units 250 fluidly connected in parallel to one another, and the groups are arranged in a plurality of clusters, each cluster comprising two or more groups fluidly connected in series.

In the illustrative embodiment of FIG. 3, the cooling assembly 100 includes three clusters 110A, 110B and 110C. The clusters 110A, 110B and 110C are fluidly connected in parallel to one another to form an arrangement fluidly connected to the main liquid inlet 102 and the main liquid outlet 104. In this embodiment, each of the clusters 110A, 110B and 110C includes four groups of liquid cooling units 250, the liquid cooling units 250 of a same group being fluidly connected to one another in parallel, the groups of liquid cooling units 250 of a same cluster being fluidly connected in series.

In this non-limiting example, the cluster 110A comprises four groups 112A, 114A, 116A and 118A, each one of said groups comprising sixteen liquid cooling units 250. In use, the heat-transfer liquid flows from the main liquid inlet 102 to the first group 112A and traverses internal liquid conduits of the liquid cooling units 250 of the first group 112A in parallel. Once the heat-transfer liquid is outputted by the group 112A, the heat-transfer liquid further flows in the one or more liquid cooling units 250 of the group 114A, the one or more liquid cooling units 250 of the group 116A and the one or more liquid cooling units 250 of the group 118A before being conveyed to the main liquid outlet 104.

In parallel to the groups of the cluster 110A, the heat-transfer liquid flows in the internal liquid conduits of the one or more liquid cooling units 250 of the groups 112B-118B and 112C-118C of the clusters 110B and 110C in a similar manner.

It should be noted that there is no a priori limitation to the number of clusters, to the number of groups per cluster and/or to the number of liquid cooling units per groups within the cooling assembly 100. The actual configuration of the cooling assembly 100 will be determined according to the needs of a particular implementation, related to, for example and without limitation, the size of an infrastructure in which the cooling assembly 100 is installed, the number and nature of the heat-generating components, and/or an excepted power consumption of the heat-generating components with respect to desired temperatures heat-transfer liquid upstream and downstream the liquid cooling units.

Figure 4:
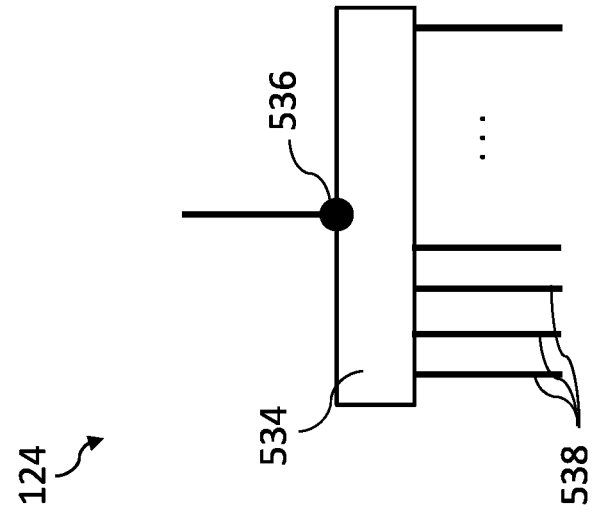
FIG. 4 is schematic diagrams of an inlet manifold and an outlet manifold of the cooling assembly of FIG. 4 in accordance with an embodiment of the present technology.
Figure 4:
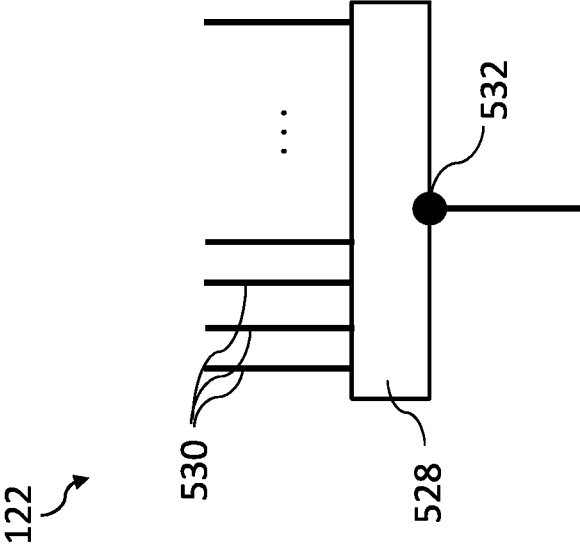

More specifically, the cooling assembly 100 includes, in this embodiment, an inlet manifold and an outlet manifold at each group of liquid cooling units 250 in order to fluidly connect said liquid cooling units 250 of the same group in parallel with one another. For example, the group 114a includes an inlet manifold 122 fluidly connected to the liquid inlets of the liquid cooling units 250 of the group 112A. With reference to FIG. 4, the manifold 122 includes a multi-port inlet 528 having a plurality of ports 530 connectable to the liquid inlets 256 and/or 258 of the one or more liquid cooling units 250 of the group 112A. The manifold 122 further includes one port 532 for receiving the heat-transfer liquid from the main liquid inlet 102. The group 112A further includes an outlet manifold 124 including a multi-port outlet 534 having a plurality of ports 538 for receiving the warmed heat-transfer liquid from the liquid outlets 268 and/or 270 of the one or more liquid cooling units 250 of the group 112A. The outlet manifold further includes a port 536 for conveying the warmed heat-transfer liquid to another downstream group (e.g. the group 114A) of the same cluster or to the main outlet 104.

Even though only the group 112A is depicted as including an inlet manifold 122 and an outlet manifold 124, it should be understood that this is merely done to simplify the illustration of FIG. 3, and that each group of the cooling assembly 100 may include an inlet manifold and an outlet manifold operating in a similar manner to the inlet manifold 122 and the outlet manifold 124 respectively.

In parallel to the groups of the cluster 110A, the heat-transfer liquid flows in the internal liquid conduits of the one or more liquid cooling units 250 of the groups of the clusters 110B and 110C in a similar manner.

Figure 5:
FIG. 5 is a schematic diagram of the cooling assembly in accordance with another embodiment of the present technology.

FIG. 5 illustrates an embodiment of the cooling assembly 100, denoted cooling assembly 100', in which each group of liquid cooling units comprises a single liquid cooling unit 250. As such, for a same number of liquid cooling units as in the cooling assembly 100 in the example of FIG. 3, the cooling assembly 110' includes a higher number of clusters. More specifically, in this embodiment, the cooling assembly 110' includes forty-eight clusters (denoted 6101 to 61048), each cluster including four groups of liquid cooling units 250, each group including a single liquid cooling unit 250.

Considering either embodiments of FIGS. 3 and 5, as the person skilled in the art would readily understand, a temperature of the heat-transfer liquid increases upon the heat-transfer liquid flowing from one group of liquid cooling units 250 to another. As such, the groups of liquid cooling units 250 may be partitioned into sets of groups of liquid cooling units 250. For example, on FIG. 3, each cluster comprises a first group, for example the groups 112A, 112B, and 112C of the clusters 110A, 110B and 110C, which may be placed in thermal contact with first corresponding servers having a first power consumption level and form a first set. Each cluster also comprises a second group, for example the groups 114A, 114B, and 114C of the clusters 110A, 110B and 110C, which may be placed in thermal contact with second corresponding servers having a second power consumption level lower than the first power consumption level and form a second set. The liquid cooling units 250 of the first set of groups 112A, 112B and 112C are thermally connected to servers having a high, first power consumption level. It may be noted that, in these clusters 110A, 110B and 110C, the second group 114A, 114B, and 114C is downstream of the first group within the cluster 112A, 112B, and 112C, respectively.

As depicted on FIG. 5, the groups of heat-generating units that receives the heat-transfer liquid directly from the main liquid inlet 102 form a first set 602 of groups. In this embodiment, the liquid cooling units of the groups of the first set 602 may for example receive the heat-transfer liquid at 30° C. and output the heat-transfer liquid at 35° C.

The groups of liquid cooling units that are directly downstream the liquid cooling units of groups of the first set form a second set 604. In this example, the liquid cooling units of the groups of the second set 604 may receive the heat-transfer liquid at 35° C. and output the heat-transfer liquid at 40° C. The groups of liquid cooling units that are directly downstream the liquid cooling units of groups of the second set form a third set 606. Continuing with the same example, the liquid cooling units of the groups of the third set 606 may receive the heat-transfer liquid at 40° C. and output the heat-transfer liquid at 45° C. The groups of liquid cooling units that are directly downstream the liquid cooling units of groups of the third set form a fourth set 608. Finally in the same example, the liquid cooling units of the groups of the fourth set 608 may receive the heat-transfer liquid at 45° C. and output the heat-transfer liquid at 50° C.

Similarly, with reference to FIG. 3, four sets of groups may be defined in the cooling assembly 100, a first set including the groups 112A, 112B and 112C, a second set including the groups 114A, 114B and 114C, a third set including the groups 116A, 116B and 116C and a fourth set including the groups 118A, 118B and 118C.

In other words, the sets of groups are defined based on a position of the groups in the main cooling loop 12 introduced in the description of FIG. 1. The groups of a same set are expected to receive the heat-transfer liquid at a same temperature. In a same cluster 110A, 110B o5 110C, the liquid cooling units 250 of different sets thus operate at different temperatures. Namely, a temperature of the heat-transfer liquid flowing in the liquid cooling units 250 of different sets in a same cluster should increase along the main cooling loop 12 (i.e. should increase with the numbering of the sets as previously defined).

In some embodiments, allocation of the liquid cooling units 250 of the different sets on the heat-generating components 50 is made based on power consumption data of the heat-generating component 50. In the context of the present disclosure, the power consumption data of a given heat-generating component 50 is indicative of real or expected power consumption level of the heat-generating component 50. Indeed, said real or expected power consumption level is related to real or expected thermal energy expelled by the heat-generating component 50. As a result, the liquid cooling units 250 operating under low temperature (i.e. the sets of groups that are the most upstream in the main cooling loop 12) may be disposed on heat-generating component 50 that have the highest real or expected power consumption level. This may enable an operator of the datacenter to have more time to react in case of a failure of the cooling assembly 100 and/or reduce probabilities of overheating of the heat-generating components 50. The developers of the present technology have realized that the aforementioned fluid connection of groups of liquid cooling units 250 in series enables the implementation of "high-density racks". Said racks may host a higher number of heat-generating components (compared to racks cooled by standard cooling systems) while still being efficiently cooled by the systems and methods described in the present disclosure.

In other words, the liquid cooling units 250 of a given set are associated with heat-generating component 50 having corresponding first real or expected power consumption levels, the liquid cooling units 250 of a following downstream set in the same cluster being associated with heat-generating components 50 having corresponding second real or expected power consumptions equal to or lower than the first real or expected power consumptions. The liquid cooling units of a most upstream set are associated with heat-generating components 50 having highest power consumption levels.

For example, the liquid cooling units 250 of the set 602 are associated with heat-generating components 50 that have higher real or expected power consumption levels than heat-generating components 50 associated with liquid cooling units 250 of the set 604.

Figure 6:
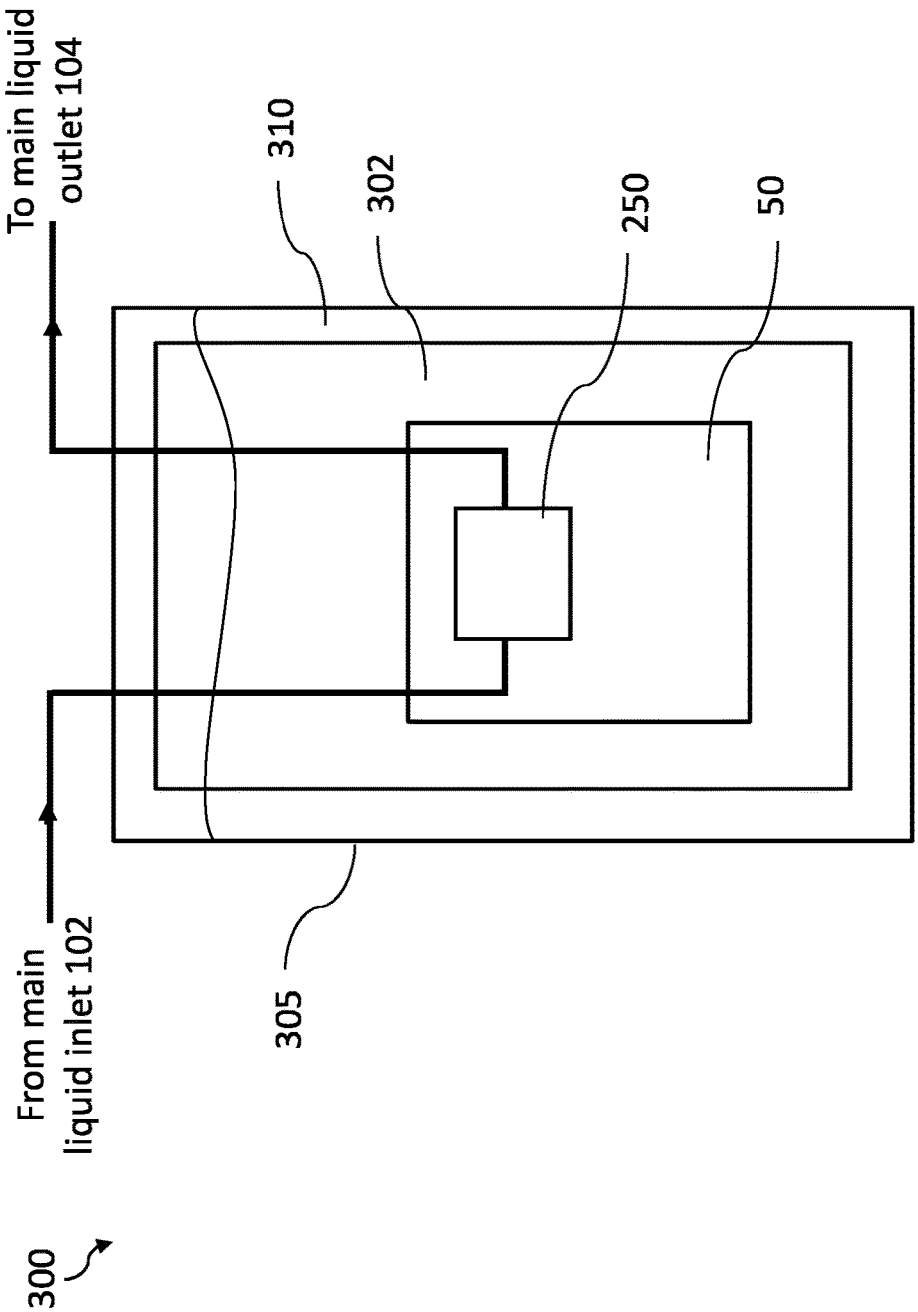
FIG. 6 is a schematic diagram of a rack-mounted assembly including the liquid cooling unit of FIG. 2 in accordance with an embodiment of the present technology.

FIG. 6 is a schematic representation of a rack-mounted assembly 300 in accordance with some embodiments of the present technology. In this embodiment, each heat-generating component 50 is disposed in a corresponding rack-mounted assembly enabling immersive cooling of the heat-generating component 50. As shown, the rack-mounted assembly 300 may include an immersion case 305 and a detachable frame 302. The detachable frame 302 may hold a corresponding one or more of the heat-generating components 50 and may be immersed in the immersion case 305. Although the immersion case 305, detachable frame 118, and heat-generating component 50 are shown as separate parts, it will be understood by one of ordinary skill in the art that, in some embodiments, two or more of these components could be combined. For example, components of the heat-generating component 50 could be fixed directly on the detachable frame 302 and/or the immersion case 305.

As used herein, an immersion cooling system is a cooling system in which the heat-generating component is in direct contact with a non-conductive (dielectric) cooling liquid, which either flows over at least portions of the electronic device, or in which at least portions of the electronic device are submerged. For example, in the rack-mounted assembly 300, the immersion case 305 may contain a dielectric immersion cooling liquid 310. Further, the detachable frame 302 including the heat-generating component 50 may be submerged in the immersion cooling case 116. In some embodiments, the dielectric immersion cooling liquid 310 and the detachable frame 302 may be inserted into the immersion case 305 via an opening (not shown on FIG. 3) at the top of the immersion case 305. In some embodiments, the opening may remain at least partially open during operation of the heat-generating component 50, providing a non-sealed configuration for the immersion case 305. Such non-sealed configurations may be easier to manufacture and maintain than sealed configurations, but may be inappropriate for, e.g., two-phase systems, in which the immersion cooling liquid may boil during operation of the heat-generating component 50.

In some embodiments, the immersion case 305 may also include structures or devices for cooling the dielectric cooling liquid. For example, a convection-inducing structure, such as a serpentine convection coil may be used to cool the dielectric cooling liquid via natural convection. Alternatively or additionally, a pump may be used to circulate the dielectric cooling liquid either within the immersion case 305 or through an external cooling system. In some embodiments, a two-phase system in which dielectric cooling liquid in a gaseous phase is cooled by condensation may be used. Generally, any technology or combination for cooling the dielectric cooling liquid may be used without departing from the principles disclosed herein. As such, in this embodiment, in addition to cooling by the liquid cooling unit 250, the heat-generating component 50 is additionally cooled by the immersion cooling.

The wording "From main liquid inlet 102" and "To main outlet 104" on FIG. 3 are not meant to indicate that the liquid cooling unit 250 is fluidly connected to the main liquid inlet 102 and the main liquid outlet 104 in a direct manner. Rather, a given liquid cooling unit 250 may be connected in series with one or more other liquid cooling units 250 as will be described in greater details herein below. The liquid cooling unit 250 depicted on FIG. 3 may thus be fluidly connected to the main liquid inlet 102 and the main liquid outlet 104 in an indirect manner.

It should be noted that, in at least some embodiments, the heat-generating component is not cooled using immersive cooling techniques, and may be surrounded by ambient air. The heat-generating component 50 may be, for example and without limitation, cooled using air-cooling techniques (e.g. using fans and/or air-to-liquid heat exchangers) in addition to the liquid cooling provided by the liquid cooling unit 250.

FIG. 7 is a flow diagram of a method 700 for cooling a plurality of heat-generating components according to some embodiments of the present technology. The method 700 includes, at step 710, mounting a plurality of liquid cooling units on the heat-generating components so that each liquid cooling unit is in thermal contact with a corresponding one of the heat-generating components to be cooled and includes a liquid inlet (e.g. liquid inlet 256) for receiving a heat-transfer liquid from a main liquid inlet (e.g. the main liquid inlet 102), a liquid outlet (e.g. liquid outlet 268) for discharging the heated heat-transfer liquid to a main liquid outlet (e.g. the main liquid outlet 104), and an internal liquid conduit extending between the liquid inlet and the liquid outlet. In use, the heat-transfer liquid thus flows in the internal liquid conduit collecting thermal energy from the corresponding heat-generating component.

The method 700 further includes fluidly connecting, at step 720, one or more liquid cooling units in parallel, thereby forming a plurality of groups of liquid cooling units (e.g. groups 112A, 114A, 116A, 118A, 112B, 114B, 116B, 118B, 112C, 114C, 116C and 118C), the liquid cooling units of a same group being fluidly connected in parallel to one another.

In some embodiment, fluid connections between the liquid cooling units are based on electrical and/or hardware characteristics of the heat-generating components. More specifically, the method 700 may include receiving power consumption data comprising information about an expected power consumption of each heat-generating components (e.g. servers). The groups of servers may further be determined based on the power consumption data. More specifically, the expected power consumption may determine a needed cooling capacity (e.g. a flow rate) of the liquid cooling units and a difference of the temperature of the heat-transfer liquid upstream and downstream the liquid cooling units. For example, the heat-generating components having their corresponding power consumption data in a same range value may be grouped in a same group.

The method 700 further includes fluidly connecting, at step 730, two or more groups in series, thereby forming at least one cluster (e.g. clusters 110A, 110B and 110C) of groups of liquid cooling units, the groups of a same cluster being fluidly connected in series, the at least one cluster being fluidly connected to the main liquid inlet for receiving the heat-transfer liquid, and to a main liquid outlet (e.g. the main liquid outlet 104) for discharging the heated heat-transfer liquid.

In some embodiments, the groups of liquid cooling units of a same cluster are formed such that the liquid cooling units of a given group are associated with servers of a same group of servers having their corresponding power consumptions in a first range value. Additionally, the liquid cooling units of another group, downstream in the cluster, are associated with servers having corresponding second power consumptions equal to or less than the first range value. The liquid cooling units of a most upstream group is associated with servers having highest power consumptions among the servers to be cooled.

In some embodiments, a plurality of clusters is formed, as depicted in the illustrative embodiments of FIGS. 3 and 5. In those embodiments, the method 700 may further include fluidly connecting the plurality of clusters in parallel to one another, the plurality of clusters being fluidly connected to the main liquid inlet and to the main liquid outlet.

In some embodiments, the cooling assembly is implemented in a datacenter, each heat-generating component corresponding to a server of the datacenter. More specifically, each liquid cooling unit is placed in thermal contact with a corresponding server of the datacenter. The cooling assembly may thus be implemented in a rack of servers, or "server rack" of the datacenter for cooling thereof.

In some embodiments, each group of liquid cooling units includes a plurality of liquid cooling units and each group further includes an outlet manifold and an inlet manifold. The outlet manifold is fluidly connected to the liquid outlets of the liquid cooling units of the corresponding group and receives the first heat-transfer liquid from said liquid cooling units. The inlet manifold is fluidly connected to the liquid inlets of the liquid cooling units of the corresponding group and receives the first heat-transfer liquid from the outlet manifold of a preceding upstream group of liquid cooling units or from the main liquid outlet, the inlet manifold distributing the first heat-transfer liquid to the plurality of liquid cooling units of the corresponding group.

In use, it may be desirable to adapt a number of liquid cooling units per group, a number of groups per cluster, and a number of clusters of the cooling assembly 100 to maintain a difference between a first temperature of the heat-transfer liquid at the main liquid inlet 102 and a second temperature of the heat-transfer liquid at the main liquid outlet 104 at or below a temperature threshold. In a particular embodiment, the temperature threshold is 20° C. It will be apparent to the person skilled in the art that said difference of temperature also depend on a flow of the first heat-transfer liquid at the main liquid inlet and characteristics of the liquid cooling units 250 (e.g. geometric characteristics of the internal liquid conduit).

To do so, in some embodiments, a temperature of the heat-transfer liquid at the main liquid inlet is 30° C., a number of clusters is three, a number of groups per cluster is four and a number of liquid cooling units per group is sixteen.

In some other embodiments, a temperature of the heat-transfer liquid at the main liquid inlet is 30° C., a number of clusters is forty-eight, a number of groups per cluster is four and a number of liquid cooling units per group is one.

In some embodiments, the method 700 further includes adjusting a flow rate according to a number of liquid cooling units 250 in the cooling assembly 100, data comprising information about electric power consumption of the heat-generating components 250 (i.e. power consumption data) and a difference between the temperature of the heat-transfer liquid at the liquid inlet 102 and the temperature of the heat-transfer liquid at the liquid outlet 104.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting.

What is claimed is:

1. A cooling assembly for cooling a plurality of heat-generating components, the cooling assembly comprising:
   a main liquid inlet;
   a main liquid outlet;
   a plurality of liquid cooling units, each liquid cooling unit configured to be in thermal contact with a corresponding one of the heat-generating components to be cooled and comprising:
   a liquid inlet fluidly connected to the main liquid inlet for receiving a first heat-transfer liquid therefrom,
   a liquid outlet fluidly connected to the main liquid outlet for returning the first heat-transfer liquid thereto; and an internal liquid conduit extending between the liquid inlet and the liquid outlet, the first heat-transfer liquid flowing in the internal liquid conduit collecting thermal energy from the corresponding heat-generating component;
wherein:
the liquid cooling units are arranged in a plurality of groups each group comprising one or more of the liquid cooling units fluidly connected in parallel to one another;
the groups are arranged in at least one cluster, each cluster comprising two or more of the groups fluidly connected in series; and
each heat-generating component corresponds to a server in a datacenter, each server having a power consumption data indicative of a real or expected power consumption level of the server,
each cluster further comprising:
a first group in thermal contact with first corresponding servers having a first real or expected power consumption level, and
a second group in thermal contact with second corresponding servers having a second real or expected power consumption level lower than the first real or expected power consumption level; and
the second group is downstream of the first group within the cluster.

2. The cooling assembly of claim 1, wherein the at least one cluster comprises a plurality of clusters fluidly connected in parallel, the clusters being fluidly connected in parallel to one another to form an arrangement fluidly connected to the main liquid inlet and the main liquid outlet.

3. The cooling assembly of claim 1, wherein:
   a first number of liquid cooling units per group, a second number of groups per cluster, and a third number of clusters of the cooling assembly are configured to maintain a difference between a first temperature of the first heat-transfer liquid at the main liquid inlet and a second temperature of the first heat-transfer liquid at the main liquid outlet at or below a first threshold.

4. The cooling assembly of claim 1, further comprising:
   a plurality of immersion cases filled with a second heat-transfer liquid, the plurality of heat-generating components being immersed in the plurality of immersion cases.

5. The cooling assembly of claim 1, wherein each cluster further comprises:
   a third group in thermal contact with third corresponding servers having a third real or expected power consumption level lower than the second real or expected power consumption level, the third group being downstream of the second group within the cluster; and
   a fourth group in thermal contact with fourth corresponding servers having a fourth real or expected power consumption level lower than the third real or expected power consumption level, the fourth group being downstream of the third group within the cluster.

6. The cooling assembly of claim 1, wherein, for each cluster:
   the liquid cooling units of a given group are associated with servers having corresponding first real or expected power consumption levels, the liquid cooling units of another group downstream of the given group being associated with servers having corresponding second real or expected power consumption levels lower than the first real or expected power consumption levels;

the liquid cooling units of a group upstream of all other groups in the cluster being associated with servers having highest real or expected power consumption levels.

7. The cooling assembly of claim 1, wherein:

each group of liquid cooling units comprises a plurality of liquid cooling units;

each group further comprises:

an outlet manifold fluidly connected to the liquid outlets of the liquid cooling units and configured to receive the first heat-transfer liquid from the liquid cooling units of the group; and an inlet manifold fluidly connected to the liquid inlets of the liquid cooling units of the group and configured to receive the first heat-transfer liquid from the outlet manifold of a preceding upstream group of liquid cooling units or from the main liquid outlet, the inlet manifold distributing the heat-transfer liquid to the plurality of liquid cooling units of the group.

8. A method for cooling a plurality of heat-generating components, the method comprising:

mounting a plurality of liquid cooling units on the heat-generating components so that each liquid cooling unit is in thermal contact with a corresponding one of the heat-generating components to be cooled, each liquid cooling unit comprising a liquid inlet for receiving a heat-transfer liquid and a liquid outlet for discharging the heat-transfer liquid;

fluidly connecting one or more of the liquid cooling units to form a plurality of groups of liquid cooling units, the liquid cooling units of a same group being fluidly connected in parallel to one another, fluidly connecting two or more groups to form at least one cluster of groups of liquid cooling units, the groups of a same cluster being fluidly connected in series; and fluidly connecting the at least one cluster to a main liquid inlet for delivering the heat-transfer liquid to the liquid inlets of the liquid cooling units and to a main liquid outlet for receiving the heat-transfer liquid from the liquid outlets of the liquid cooling units, each heat-generating component corresponds to a server in a datacenter, the method further comprising:

fluidly connecting two or more groups to form at least one cluster of groups of liquid cooling units comprising:

disposing a first group in thermal contact with first corresponding servers having a first real or expected power consumption level, and disposing a second group in thermal contact with second corresponding servers having a second real or expected power consumption level lower than the first real or expected power consumption level, the second group being downstream of the first group within the cluster, the first and second servers being identified based on the power consumption data indicative of the respective servers' real or expected power consumption levels.

9. The method of claim 8, wherein:

fluidly connecting the two or more groups to form at the least one cluster of groups of liquid cooling units comprises:

forming a plurality of clusters, the groups of a same cluster being fluidly connected in series, the plurality of clusters being fluidly connected in parallel to one another, the plurality of clusters being fluidly connected to the main liquid inlet and to the main liquid outlet.

10. The method of claim 8, further comprising:

receiving power consumption data comprising information about the expected power consumptions of each server; and identifying groups of servers of the datacenter based on the power consumption data indicative of the respective group of servers' expected power consumption levels.

11. The method of claim 8, wherein forming the at least one cluster of groups of liquid cooling units, comprises:

forming the groups of liquid cooling units such that the liquid cooling units of a given group are associated with the servers of a same group of servers having corresponding first real or expected power consumption levels, the liquid cooling units of another group downstream of the given group being associated with servers having corresponding second real or expected power consumption levels lower than the first real or expected power consumption levels, the liquid cooling units of a group upstream of all other groups in the cluster being associated with servers having highest real or expected power consumption levels.

\* \* \* \* \*